United States Patent
Ishizaki et al.

(10) Patent No.: US 10,388,831 B2
(45) Date of Patent: Aug. 20, 2019

(54) LIGHT-EMITTING DEVICE AND METHOD FOR MANUFACTURING LIGHT-EMITTING DEVICE

(71) Applicant: SHIN-ETSU HANDOTAI CO., LTD., Tokyo (JP)

(72) Inventors: Junya Ishizaki, Takasaki (JP); Shogo Furuya, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 54 days.

(21) Appl. No.: 15/538,032

(22) PCT Filed: Dec. 9, 2015

(86) PCT No.: PCT/JP2015/006121
§ 371 (c)(1),
(2) Date: Jun. 20, 2017

(87) PCT Pub. No.: WO2016/110896
PCT Pub. Date: Jul. 14, 2016

(65) Prior Publication Data
US 2017/0352783 A1  Dec. 7, 2017

(30) Foreign Application Priority Data
Jan. 9, 2015 (JP) ................... 2015-003128

(51) Int. Cl.
*H01L 33/22* (2010.01)
*H01L 33/30* (2010.01)
(Continued)

(52) U.S. Cl.
CPC ............ *H01L 33/22* (2013.01); *H01L 33/30* (2013.01); *H01L 21/306* (2013.01); *H01L 21/30604* (2013.01); *H01L 33/44* (2013.01)

(58) Field of Classification Search
CPC ....................................................... H01L 33/22
See application file for complete search history.

(56) References Cited

U.S. PATENT DOCUMENTS

| | | | |
|---|---|---|---|
| 2008/0093612 A1 | 4/2008 | Konno et al. | |
| 2010/0136728 A1* | 6/2010 | Horng | H01L 33/0079 438/29 |
| 2015/0155442 A1* | 6/2015 | Chien | H01L 33/405 257/98 |

FOREIGN PATENT DOCUMENTS

| | | |
|---|---|---|
| JP | 2006-270001 A | 10/2006 |
| JP | 2007-059518 A | 3/2007 |

(Continued)

OTHER PUBLICATIONS

Hagimoto EPO translation (JP 2007042664).*
(Continued)

*Primary Examiner* — Peniel M Gumedzoe
*Assistant Examiner* — Christopher A Johnson
(74) *Attorney, Agent, or Firm* — Oliff PLC (57) ABSTRACT

A light-emitting device including a window layer-cum-support substrate, a light-emitting portion provided on the window layer-cum-support substrate and including a second semiconductor layer of a second conductivity type, an active layer, and first semiconductor layer of a first conductivity type in stated order, a first ohmic electrode provided on the first semiconductor layer, and insulator top coat at least partially coating the first semiconductor layer surface and light-emitting portion side surface, wherein the first semiconductor layer surface and surface of the window layer-cum-support substrate are roughened, and the first semiconductor layer includes at least two layers of an active-layer-side layer and roughened-side layer, and roughened-side layer is formed of material having lower Al content than the active-layer-side layer. This light-emitting device can reduce (Continued)

etching depth required to obtain desired roughened shape and inhibit occurrence of chip cracks during wire bonding, while keeping effect of trapping carriers in the clad layer.

6 Claims, 4 Drawing Sheets

(51) Int. Cl.
*H01L 21/306* (2006.01)
*H01L 33/44* (2010.01)

(56) References Cited

FOREIGN PATENT DOCUMENTS

| | | |
|---|---|---|
| JP | 2008-103627 A | 5/2008 |
| JP | 2009-252860 A | 10/2009 |
| JP | 4569858 B2 | 10/2010 |
| JP | 2010-251531 A | 11/2010 |
| JP | 2011-142231 A | 7/2011 |
| JP | 4715370 B2 | 7/2011 |
| JP | 2012-142508 A | 7/2012 |
| JP | 5427585 B2 | 2/2014 |
| JP | 2014-195069 A | 10/2014 |

OTHER PUBLICATIONS

Jan. 12, 2016 International Search Report issued in International Patent Application No. PCT/JP2015/006121.
Aug. 28, 2018 Office Action issued in Chinese Patent Application No. 201580069819.6.

* cited by examiner

LIGHT-EMITTING DEVICE AND METHOD FOR MANUFACTURING LIGHT-EMITTING DEVICE

TECHNICAL FIELD

The present invention relates to a light-emitting device and a method for manufacturing a light-emitting device, and more particularly to a structure and a manufacturing method in which a first semiconductor layer, an active layer, a second semiconductor layer, and a window layer-cum-support substrate are formed on a substrate by epitaxial growth, and after removing the substrate, the light-emitting device substrate having electrodes formed thereon is subjected to surface roughening treatment.

BACKGROUND ART

In recent years, a light-emitting diode (LED) has improved its efficiency and has been increasingly applied to lighting apparatuses. Most conventional lighting apparatuses combine an InGaN-based blue LED and a fluorescent agent. Unfortunately, the use of the fluorescent agent inevitably causes stokes loss in principle, and not all lights received by the fluorescent agent can be converted into other wavelengths. In particular, this problem is prominent in regions of yellow and red having relatively longer wavelengths than that of blue.

To solve this problem, a technique combining a yellow or red LED with a blue LED has been recently adopted. In this regard, a bulb type lighting apparatus, in which LEDs are arranged on a board to form a filament for emitting light, has been widely spread rather than a COB (chip on board) type, in which light is extracted to one surface. LED devices used in the apparatus of this type need to extract light over the entire filament surface. Thus, a device that extracts light to one side is not suitable, and a device having light distribution to extract light in every direction of a chip is ideal.

For the InGaN-based LED, which is the blue LED, a sapphire substrate is generally used. The sapphire substrate is transparent to emission wavelength, and thus is ideal for the above-described lighting apparatus. For the yellow or red LED, however, GaAs or Ge, which can absorb light with emission wavelength, is used as a starting substrate, and is unsuitable for the above-described use.

To solve this problem, there have been disclosed a method in which a transparent substrate is bonded to a light-emitting portion as described in Patent Document 1; and a technique in which a window layer is grown to have a sufficient thickness to be used as a support substrate, and a starting substrate that is a light-absorbing substrate is removed to provide an LED as described in Patent Document 2.

The method disclosed in Patent Document 1 requires bonding a transparent substrate thicker than necessary, and grinding the substrate to a predetermined thickness after bonding, which can increase the cost. Moreover, the substrate used for bonding usually has a thickness of 200 μm or more. Considering light distribution characteristics and assembly properties with other devices, the thickness required for an LED device is approximately 100 μm at most, and thus the substrate requires thinning to this degree of thickness. The thinning processing increases the number of processes and a risk of cracking the wafer, causing an increase in cost and a reduction in yield.

On the other hand, the method disclosed in Patent Document 2, which utilizes, as a support substrate, a window layer grown by crystal growth to have a sufficient thickness for the support substrate, includes growing the window layer to a desired thickness, and does not require thinning processing and substrate joining/bonding processes. Thus, this method enables low-cost formation and is excellent.

The light-emitting device having a transparent support substrate as described above generally employs a technique for preventing multiple reflection within the light-emitting device and inhibiting light absorption in order to enhance luminous efficiency. Patent Document 3 proposes a method for roughening the surfaces of a window layer-cum-current diffusion layer and a window layer-cum-support substrate, but not roughening the surface of a light-emitting portion in a structure where the light-emitting portion is sandwiched between the thick window layer-cum-current diffusion layer and the thick window layer-cum-support substrate. However, this method requires forming a deep trench that pierces through the window layer-cum-current diffusion layer, which increases the cost, and makes a vertical distance between upper and lower electrode portions large, which causes a difficulty in wire bonding. In the application to a flip chip type, a thick insulator film and a very long metal via must be formed, which causes the increase in cost. It is thus desirable for the window layer-cum-current diffusion layer used as the upper electrode portion to be thin.

Patent Documents 4 and 5 disclose techniques in which the window layer-cum-current diffusion layer is thin, the vertical distance between upper and lower electrode portions is short, and a light-extracting portion or a light-reflecting portion has a roughened surface. In Patent Document 4, the roughened surface is formed on an n-type semiconductor layer surface at the opposite side of a light-extracting surface. However, this disclosure relates to the flip chip type, and intends to efficiently reflect light from an electrode side to a window layer side. Moreover, this document discloses a difficulty in forming roughened surfaces on both the window layer-cum-support substrate and the light-emitting portion.

Patent Document 5 discloses a technique for roughening the surface of an AlGaInP-based clad layer. According to the technique disclosed in Patent Document 5, a clad layer is made of $(Al_{0.5}Ga_{0.5})_{0.5}In_{0.5}P$, and a window layer made of $(Al_xGa_{1-x})_{0.5}In_{0.5}P$ ($0.5<x$) is formed on an upper part of the clad layer. That is, the disclosed technique indicates that the layer to be roughened is made of a material having a higher Al content than that of the clad layer.

CITATION LIST

Patent Literature

Patent Document 1: Japanese Patent No. 5427585
Patent Document 2: Japanese Patent No. 4569858
Patent Document 3: Japanese Patent No. 4715370
Patent Document 4: Japanese Unexamined Patent Application Publication No. 2007-059518
Patent Document 5: Japanese Unexamined Patent Application. No. 2010-251531

SUMMARY OF INVENTION

Technical Problem

However, in the light-emitting device having the window layer-cum-support substrate portion and the light-emitting portion, if an electrode with thin wire is provided on the surface of the light-emitting portion, and the light-emitting portion is subjected to surface roughening treatment by etching, a higher Al content leads to a higher etching rate and makes the surface roughening treatment difficult. Thus, the etching depth requires increasing in order to obtain a desired roughened surface. As a result, excessive etching is performed from the pad electrode forming surface, and the mechanical strength of the pad electrode portion is decreased. This increases a risk of causing cracks on a chip during wire bonding.

On the other hand, the Al content of the clad layer requires increasing in order to enhance an effect of trapping carriers that are implanted into an active layer. However, as mentioned above, when the Al content is increased, the etching depth is increased in order to obtain a desired roughened surface. Accordingly, it is also necessary to significantly increase the thickness of the clad layer to be thicker than a minimum thickness required for trapping carriers.

Therefore, no one has yet disclosed a technique that can effectively perform the surface roughening treatment while keeping the effect of trapping carriers in the clad layer and keeping the mechanical strength of the bonding pad.

The present invention was accomplished in view of the above-described problems. It is an object of the present invention to provide a light-emitting device that has a window layer-cum-support substrate and a light-emitting portion, and can reduce the etching depth required to obtain a desired roughened shape and inhibit occurrence of chip cracks during wire bonding, while keeping the effect of trapping carriers in the clad layer, when the surface of the light-emitting portion is roughened by a surface roughening liquid (an etching liquid).

Solution to Problem

To achieve this object, the present invention provides a light-emitting device comprising: a window layer-cum-support substrate; and a light-emitting portion provided on the window layer-cum-support substrate and including a second semiconductor layer of a second conductivity type, an active layer, and a first semiconductor layer of a first conductivity type in the stated order, the light-emitting device further comprising:
a first ohmic electrode provided on the first semiconductor layer; and an insulator top coat at least partially coating a surface of the first semiconductor layer and a side surface of the light-emitting portion, wherein
the surface of the first semiconductor layer and a surface of the window layer-cum-support substrate are roughened, and
the first semiconductor layer includes at least two layers of an active-layer-side layer and a roughened-side layer, and the roughened-side layer is formed of a material having a lower Al content than that of the active-layer-side layer.

This light-emitting device can reduce the etching depth required to obtain a desired roughened shape and inhibit occurrence of chip cracks during wire bonding, while keeping the effect of trapping carriers in the clad layer.

The light-emitting device preferably comprises a removal section in which a part of the light-emitting portion is removed; a non-removal section other than the removal section; the first ohmic electrode provided on the first semiconductor layer in the non-removal section; and a second ohmic electrode provided on the window layer-cum-support substrate or the second semiconductor layer in the removal section.

Such a structure makes the present invention more effective.

Preferably, the roughened-side layer of the first semiconductor layer comprises $(Al_xGa_{1-x})_yIn_{1-y}P$ where $0 \leq x < 0.6$ and $0.4 \leq y \leq 0.6$, or $Al_zGa_{1-z}As$ where $0 \leq z \leq 0.3$, and
the active-layer-side layer of the first semiconductor layer comprises $(Al_xGa_{1-x})_yIn_{1-y}P$ where $0.6 \leq x \leq 1$ and $0.4 \leq y \leq 0.6$, or $Al_zGa_{1-z}As$ where $0.3 < z \leq 1$.

This ensures that the light-emitting device can reduce the etching depth required to obtain a desired roughened shape and inhibit occurrence of chip cracks during wire bonding, while keeping the effect of trapping carriers in the clad layer.

Furthermore, the present invention provides a method for manufacturing a light-emitting device, the method comprising:
a step of forming a light-emitting portion by sequentially growing a first semiconductor layer, an active layer, and a second semiconductor layer on a substrate by epitaxial growth using a material whose lattice matches with the substrate;
a step of forming a window layer-cum-support substrate on the light-emitting portion by epitaxial growth using a material whose lattice mismatches with the substrate; a step of removing the substrate;
a step of forming a first ohmic electrode on the first semiconductor layer;
a first surface roughening treatment step of roughening a surface of the first semiconductor layer;
a device isolation step of forming a removal section in which a part of the light-emitting portion is removed and a non-removal section other than the removal section;
a step of forming a second ohmic electrode on the window layer-cum-support substrate with the light-emitting portion being removed therefrom;
a step of at least partially coating the surface of the first semiconductor layer and a side surface of the light-emitting portion with an insulator top coat; and
a second surface roughening treatment step of roughening a surface and a side surface of the window layer-cum-support substrate, wherein
in the step of forming the light-emitting portion, the first semiconductor layer is formed so as to have at least two layers of an active-layer-side layer and a roughened-side layer, and the roughened-side layer is formed of a material having a lower Al content than that of the active-layer-side layer.

This manufacturing method enables manufacture of a light-emitting device that can reduce the etching depth required to obtain a desired roughened shape and inhibit occurrence of chip cracks during wire bonding, while keeping the effect of trapping carriers in the clad layer.

Preferably, the roughened-side layer of the first semiconductor layer comprises $(Al_xGa_{1-x})_yIn_{1-y}P$ where $0 \leq x < 0.6$ and $0.4 \leq y \leq 0.6$, or $Al_zGa_{1-z}As$ where $0 \leq z \leq 0.3$, and
the active-layer-side layer of the first semiconductor layer comprises $(Al_xGa_{1-x})_yIn_{1-y}P$ where $0.6 \leq x \leq 1$ and $0.4 \leq y \leq 0.6$, or $Al_zGa_{1-z}As$ where $0.3 < z \leq 1$.

This ensures manufacture of a light-emitting device that can reduce the etching depth required to obtain a desired roughened shape and inhibit occurrence of chip cracks during wire bonding, while keeping the effect of trapping carriers in the clad layer.

Preferably, the first surface roughening treatment step is carried out by using a liquid mixture of an organic acid and an inorganic acid, the organic acid including any one or more of citric acid, malonic acid, formic acid, acetic acid, and tartaric acid, the inorganic acid including any one or more of hydrochloric acid, sulfuric acid, nitric acid, and hydrofluoric acid, and the second surface roughening treatment step is carried out by using a mixed solution containing iodine, an organic acid, and an inorganic acid, the organic acid including any one or more of citric acid, malonic acid, formic acid, acetic acid, and tartaric acid, the inorganic acid including any one or more of hydrochloric acid, sulfuric acid, nitric acid, and hydrofluoric acid.

In this manner, a light-emitting device having a roughened surface with a desired size of irregularities can be surely manufactured.

Advantageous Effects of Invention

The present invention can provide a light-emitting device that can reduce the etching depth required to obtain a desired roughened shape and inhibit occurrence of chip cracks during wire bonding, while keeping the effect of trapping carriers in the clad layer.

Furthermore, the method for manufacturing a light-emitting device according to the present invention enables manufacture of a light-emitting device that can reduce the etching depth required to obtain a desired roughened shape and inhibit occurrence of chip cracks during wire bonding, while keeping the effect of trapping carriers in the clad layer.

DESCRIPTION OF EMBODIMENTS

Hereinafter, embodiments of the present invention will be described, but the present invention is not limited thereto.

As mentioned above, the following problem arises in recent years: in a light-emitting portion having a roughened surface formed by a surface roughening liquid, if a layer with the roughened surface has an Al content equal to or higher than that of a clad layer part, irregularity size on the roughened surface is reduced due to an excessively high etching rate, and the surface roughening treatment cannot be effectively performed. In view of this, the present inventors repeatedly and keenly conducted studies to prevent the high etching rate at surface roughening etching and following insufficient irregularity.

As a result, they found that when the first semiconductor layer is composed of two or more layers each having Al composition, in which a material of the layer to be roughened has a lower Al content than that of the layer at the active layer side, it is possible to prevent the occurrence of chip cracks during wire bonding by the reduction in mechanical strength of the pad electrode portion due to excessive etching, while keeping the effect of trapping carriers in the clad layer, and thus a roughened surface with desired irregularities can be obtained. Then, they considered the best embodiment to realize the above ideas, thereby bringing the present invention to completion.

First, the light-emitting device according to the present invention will be described with reference to FIG. 1.

Figure 1:
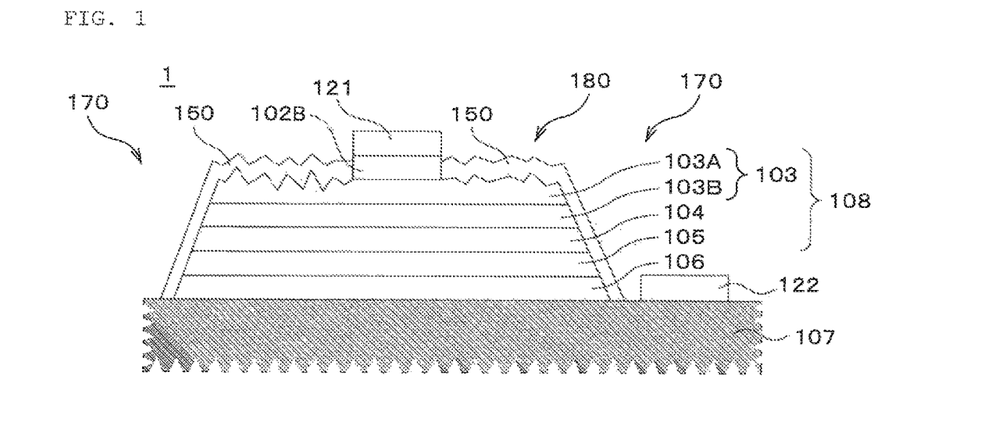
FIG. 1 is a schematic view showing an example of the light-emitting device according to the present invention.

As shown in FIG. 1, a light-emitting device 1 of the present invention has a window layer-cum-support substrate 107 and a light-emitting portion 108 that is provided on the window layer-cum-support substrate 107 and includes a second semiconductor layer 105 of a second conductivity type, an active layer 104, and a first semiconductor layer 103 of a first conductivity type in the stated order.

On the first semiconductor layer 103, a first ohmic electrode 121 is provided. Additionally, a surface of the first semiconductor layer 103 and a side surface of the light-emitting portion 108 are at least partially coated with an insulator top coat 150, and the surface of the first semiconductor layer 103 and a surface and a side surface of the window layer-cum-support substrate 107 are roughened.

As shown in FIG. 1, the first ohmic electrode 121 may be provided on the first semiconductor layer 103 with a first selective etching layer 102B being inserted therebetween.

As shown in FIG. 1, the first semiconductor layer 103 includes at least two layers. The roughened-side layer (hereinafter, referred to as a low-Al-content layer 103A) is formed of a material having a lower Al content than that of the active-layer-side layer (hereinafter, referred to as a high-Al-content layer 103B).

More specifically, the low-Al-content layer 103A may be composed of $(Al_xGa_{1-x})_yIn_{1-y}P$ ($0 \leq x < 0.6$, $0.4 \leq y \leq 0.6$) or $Al_zGa_{1-z}As$ ($0 \leq z \leq 0.3$), while the high-Al-content layer 103B may be composed of $(Al_xGa_{1-x})_yIn_{1-y}P$ ($0.6 \leq x \leq 1$, $0.4 \leq y \leq 0.6$) or $Al_zGa_{1-z}As$ ($0.3 < z \leq 1$).

The light-emitting device 1 preferably includes a removal section 170 in which at least the first semiconductor layer 103 and the active layer 104 of the light-emitting portion 108 are removed, and a non-removal section 180 other than the removal section 170. When the light-emitting portion is removed up to the active layer 104, the surface of the removal section 170 is the second semiconductor layer 105. When the light-emitting portion is removed up to a buffer layer 106, the surface of the removal section 170 is the window layer-cum-support substrate 107.

Furthermore, the light-emitting device preferably includes the first ohmic electrode 121 provided on the first semiconductor layer 103 in the non-removal section 180 and a second ohmic electrode 122 provided on the window layer-cum-support substrate 107 or the second semiconductor layer 105 in the removal section 170.

Such a structure makes the present invention more effective.

Such a light-emitting device of the present invention can reduce the etching depth required to obtain a desired roughened shape and inhibit occurrence of chip cracks during wire bonding, while keeping the effect of trapping carriers in the clad layer.

Next, the method for manufacturing a light-emitting device according to the present invention will be described with reference to FIG. 2 to FIG. 8.

Figure 2:
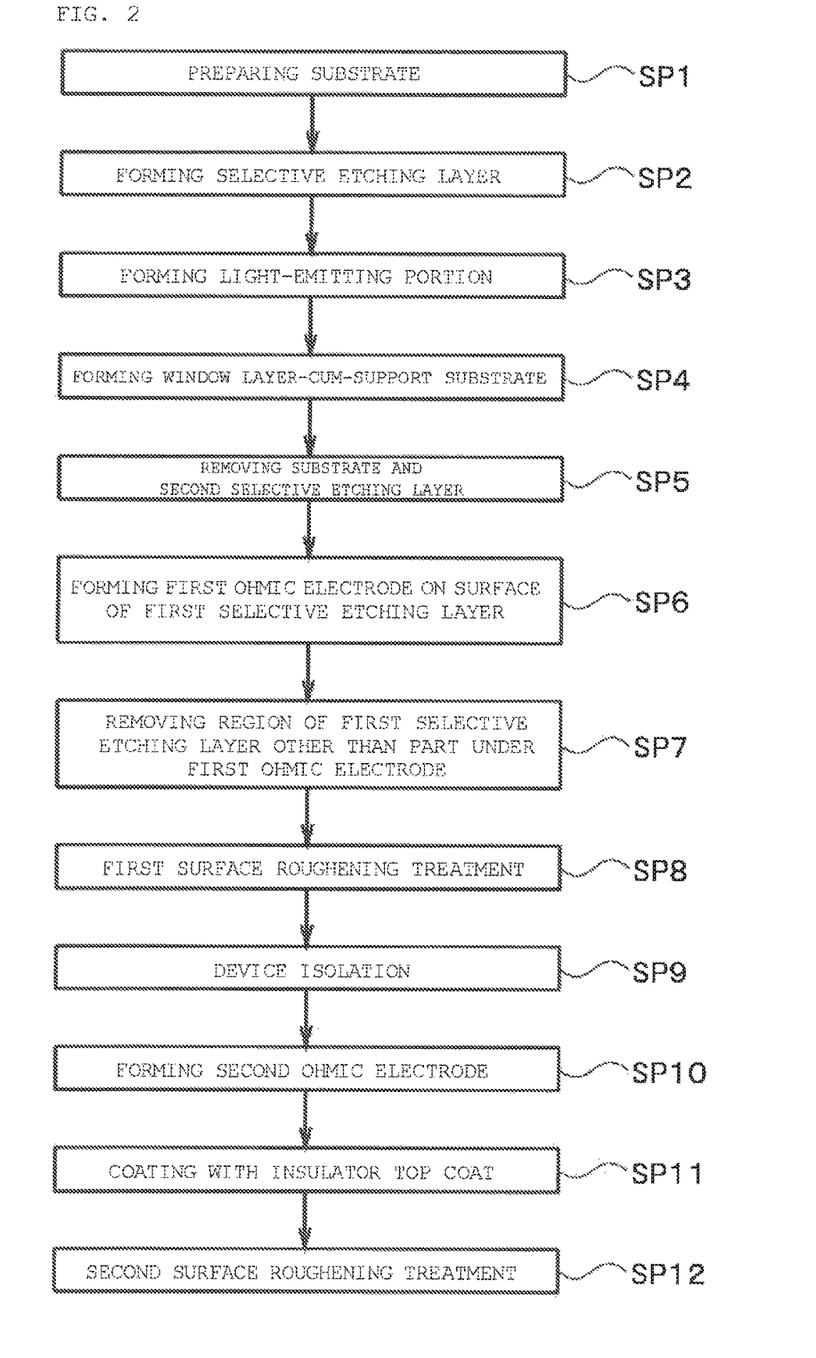
FIG. 2 is a process drawing showing an example of the method for manufacturing a light-emitting device according to the present invention.
Figure 3:
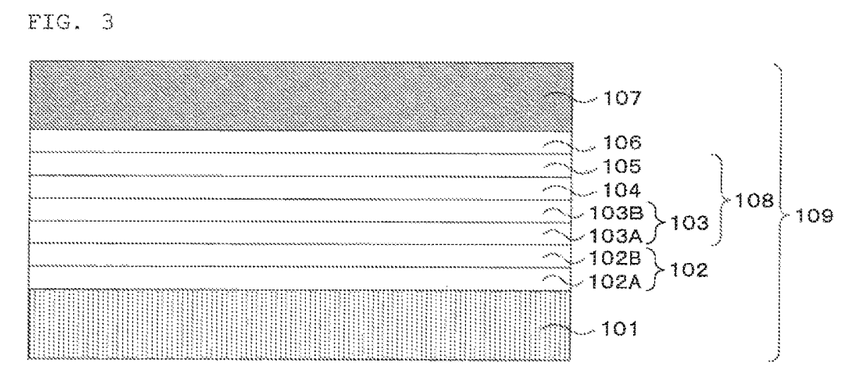
FIG. 3 is a schematic view showing an epitaxial substrate having a selective etching layer, a light-emitting portion, and a window layer-cum-support substrate grown on a substrate in a manufacturing process of the method for manufacturing a light-emitting device according to the present invention.

First, as shown in FIG. 3, a substrate 101 is prepared as a starting substrate (SP1 in FIG. 2).

As the substrate 101, GaAs or Ge can be preferably used.

This allows epitaxial growth using a lattice-matched material to form an active layer 104 described later, and thus can easily improve quality of the active layer 104, improving luminance and lifetime characteristics.

Then, a selective etching layer 102 may be formed on the substrate 101 (SP2 in FIG. 2).

The selective etching layer 102 can be formed on the substrate 101 by, for example, an MOVPE method (a metal organic vapor phase epitaxy method), MBE (molecular beam epitaxy method), or CBE (chemical beam epitaxy method).

The selective etching layer 102 is preferably formed of two or more layers, including at least a second selective etching layer 102A adjoining the substrate 101 and a first selective etching layer 102B adjoining a later-described first semiconductor layer 103. Materials or compositions of the second selective etching layer 102A and the first selective etching layer 102B may be different from each other.

Then, a first semiconductor layer 103 of a first conductivity type, an active layer 104, and a second semiconductor layer 105 of a second conductivity type that have lattice matching with the substrate 101 are sequentially grown by epitaxial growth to form a light-emitting portion 108 (SP3 in FIG. 2).

Then, a window layer-cum-support substrate 107 is formed on the light-emitting portion 108 by epitaxial growth using a material whose lattice mismatches with the substrate 101 to produce an epitaxial substrate 109 (SP4 in FIG. 2).

In SP3 and 4, specifically, as shown in FIG. 3, a buffer layer 106 and the window layer-cum-support substrate 107 may be formed by epitaxial growth, in the stated order, on the light-emitting portion 108 composed of the first semiconductor layer 103 of a first conductivity type, the active layer 104, and the second semiconductor layer 105 of a second conductivity type to produce the epitaxial substrate 109.

The window layer-cum-support substrate 107 may be formed by an HVPE method (a hydride vapor phase epitaxy method).

The active layer 104 may be formed of $(Al_xGa_{1-x})_yIn_{1-y}P$ ($0 \leq x \leq 1$, $0.4 \leq y \leq 0.6$) or $Al_zGa_{1-z}As$ ($0 \leq z \leq 0.45$), depending on emission wavelength. For example, AlGaInP is preferably selected for the application to visible light illumination, and AlGaAs is preferably selected for the application to infrared illumination. However, as regards the design of the active layer 104, since the wavelength can be adjusted to be a wavelength other than that attributable to the material composition by use of superlattice or the like, this layer is not restricted to the above materials.

AlGaInP or AlGaAs is selected for the first semiconductor layer 103 and the second semiconductor layer 105, and this selection is not necessarily the same as the material of the active layer 104.

The present embodiment shows the case where the structure is the most simplest, i.e., the first semiconductor layer 103, the active layer 104, and the second semiconductor layer 105 are made of the same material, AlGaInP. However, each layer of the first semiconductor layer 103 and the second semiconductor layer 105 usually contains a plurality of layers to improve characteristics, and each of the first semiconductor layer 103 and the second semiconductor layer 105 is not limited to a single layer, needless to say.

The first semiconductor layer 103 is formed so as to have at least two layers. In the first semiconductor layer 103, the low-Al-content layer 103A at the side to be roughened is formed of a material having a lower Al content than that of the high-Al-content layer 103B at the active layer side.

The high-Al-content layer 103B is a functional layer that functions as a clad layer, and is not limited to a single composition or a single condition layer.

More specifically, the low-Al-content layer 103A may be composed of $(Al_xGa_{1-x})_yIn_{1-y}P$ ($0 \leq x < 0.6$, $0.4 \leq y \leq 0.6$) or $Al_zGa_{1-z}As$ ($0 \leq z \leq 0.3$), while the high-Al-content layer 103B may be composed of $(Al_xGa_{1-x})_yIn_{1-y}P$ ($0.6 \leq x \leq 1$, $0.4 \leq y \leq 0.6$) or $Al_zGa_{1-z}As$ ($0.3 < z \leq 1$).

For the window layer-cum-support substrate 107, GaP, GaAsP, AlGaAs, sapphire ($Al_2O_3$), quartz ($SiO_2$), SiC, or the like can be preferably used. When the window layer-cum-support substrate 107 is formed of GaAsP or GaP, the buffer layer 106 is most preferably formed of GaInP. However, a material of the buffer layer 106 may be any material that has a buffering function, and is not limited to the above material, needless to say.

Moreover, when GaAsP is selected for the window layer-cum-support substrate 107, weather resistance is excellent.

However, since GaAsP has considerable lattice mismatch with an AlGaInP-based material or an AlGaAs-based material, GaAsP is given high-density distortion or threading dislocation. Consequently, the epitaxial substrate 109 has large warp.

To avoid a wavelength shift due to formation of natural superlattice, the light-emitting section 108 is preferably grown with a crystallographic inclination at 12 degrees or more to a growth surface. Although any direction can be selected as the inclining direction, when a scribing and breaking process is employed in the device isolation step, one scribe line may be selected in a direction in which a crystal axis is orthogonal without inclination, while the other scribe line may be selected in a direction in which the crystal axis is inclined. This enables a reduction of a plane where the side surface of the device inclines to the front surface and the back surface of the device. Thus, a non-inclined direction is usually selected for the one scribe line. However, about 20 degrees of inclination of the device side surface is not a serious problem in assembly. Therefore, the orthogonal direction does not have to be accurately orthogonal, and permits an angular range of about ±20 degrees from a right angle.

Figure 4:
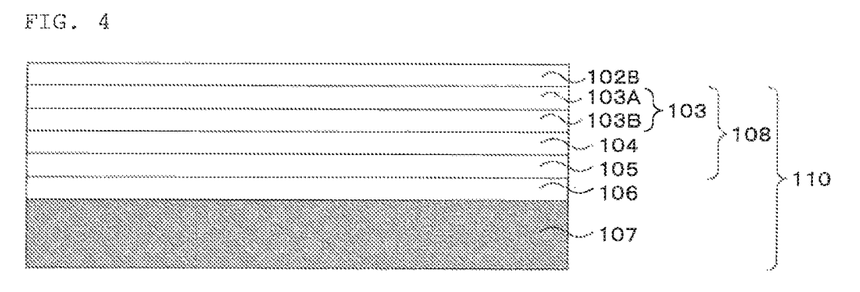
FIG. 4 is a schematic view showing a light-emitting device substrate provided by removing the substrate and a second selective etching layer from the epitaxial substrate in the manufacturing process of the method for manufacturing a light-emitting device according to the present invention.

Then, the substrate 101 and the second selective etching layer 102A are removed from the epitaxial substrate 109, and only the first selective etching layer 102B is left on the surface of the first semiconductor layer 103 to form a light-emitting device substrate 110, as shown in FIG. 4 (SP5 in FIG. 2).

More specifically, only the first selective etching layer 102B can be left on the surface of the first semiconductor layer 103 by removing the substrate 101 from the epitaxial substrate 109 according to a wet etching method using the second selective etching layer 102A.

Figure 5:
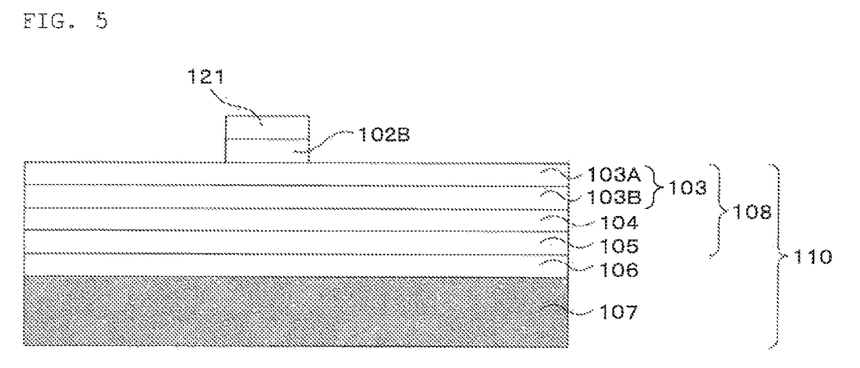
FIG. 5 is a schematic view showing the light-emitting device substrate having a first ohmic electrode formed thereon in the manufacturing process of the method for manufacturing a light-emitting device according to the present invention.

Then, as shown in FIG. 5, a first ohmic electrode 121 for supplying a potential to the light-emitting device is formed on the surface of the first selective etching layer 102B on the first semiconductor layer 103 (SP6 in FIG. 2).

Then, as shown in FIG. 5, a region of the first selective etching layer 102B other than a part under the first ohmic electrode 121 is removed (SP7 in FIG. 2).

More specifically, the region of the first selective etching layer 102B other than the part under the first ohmic electrode 121 can be removed by etching using the first ohmic electrode 121 as an etching mask.

Figure 6:
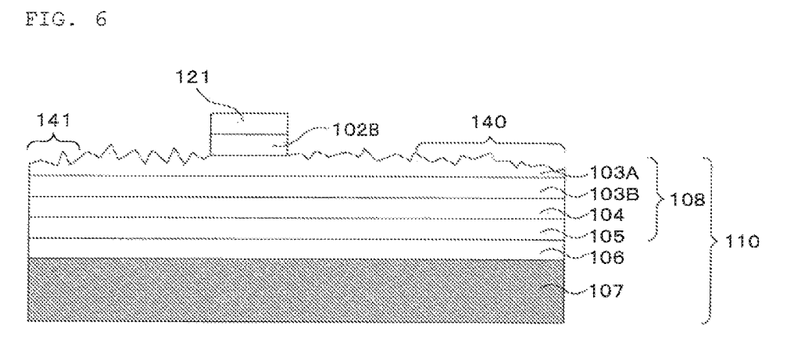
FIG. 6 is a schematic view showing the light-emitting device substrate subjected to the first surface roughening treatment in the manufacturing process of the method for manufacturing a light-emitting device according to the present invention.

Then, as shown in FIG. 6, the surface of the first semiconductor layer 103 is roughened in a first surface roughening treatment step (SP8 in FIG. 2).

The first surface roughening treatment step may be carried out by using a liquid mixture of an organic acid and an inorganic acid, in which the organic acid may include a carboxylic acid, particularly, any one or more of citric acid, malonic acid, formic acid, acetic acid, and tartaric acid, and the inorganic acid may include one or more of hydrochloric acid, sulfuric acid, nitric acid, and hydrofluoric acid.

In this manner, the surface can be surely roughened.

At this time, the first surface roughening liquid is preferably used for mainly subjecting the low-Al-content layer 103A to the first surface roughening treatment. In the case that the low-Al-content layer 103A and the high-Al-content layer 103B are made of the same type of materials, for example, both the layers are made of AlGaInP-based materials, the etching rate of the high-Al-content layer 103B is higher than that of the low-Al-content layer 103A. Thus, if etching of the high-Al-content layer 103B is undesirable, the thickness of the low-Al-content layer 103A is preferably made thicker than a depth to be etched.

On the other hand, if one intends to partially etch the high-Al-content layer 103B by using irregularities generated on the low-Al-content layer 103A as an etching pattern to increase the irregularities, the thickness of the low-Al-content layer 103A is preferably made thinner than a depth to be etched.

In the first surface roughening treatment step, the size of irregularities on the roughened surface can be determined by an Al content of the low-Al-content layer 103A. For example, a roughness $R_a$ (arithmetic average roughness) of about 0.3 μm can be achieved by etching the low-Al-content layer 103A having the above composition with an etching depth of, e.g., 0.3 to 0.6 μm.

On the other hand, when the etching depth is decreased to less than 0.3 to 0.6 μm, $R_a$ can be reduced. Moreover, when the etching depth is increased to more than 0.3 to 0.6 μm, $R_a$ can be reduced since the roughened surface is flattened.

For increasing $R_a$, the low-Al-content layer 103A is formed to be slightly thinner than a depth to be etched. Since the low-Al-content layer has low etching rate whereas the high-Al-content layer has high etching rate the etching rate is accelerated from a part where the low-Al-content layer 103A is removed by etching. The part is deeply etched, and $R_a$ is increased.

In addition, when the first selective etching layer 102B is made of a material having an etching selectivity to the first surface roughening liquid, the first surface roughening liquid forms a facet plane along the shape of the first ohmic electrode. In this manner, providing the first selective etching layer 102B under the first ohmic electrode 121 prevents occurrence of over-etching under the first ohmic electrode 121, inhibiting separation of the electrode on the surface of the light-emitting portion.

Figure 7:
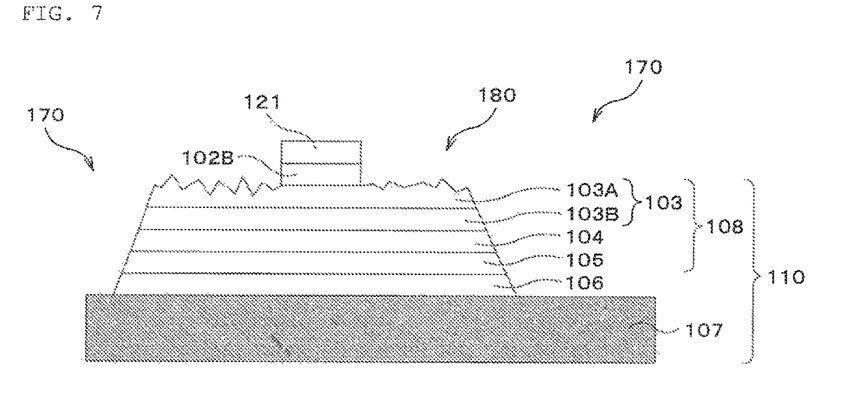
FIG. 7 is a schematic view showing the light-emitting device substrate subjected to the device isolation step in the manufacturing process of the method for manufacturing a light-emitting device according to the present invention.

Then, as shown in FIG. 7, a part of the light-emitting portion 108 is removed to form a removal section 170 and a non-removal section 180 other than the removal section in a device isolation step (SP9 in FIG. 2).

The device isolation step can be carried out by, for example, forming a pattern of a resist in which predetermined regions (a second ohmic electrode forming region 140 and a scribe region 141 in FIG. 6) on the first semiconductor layer 103 are opened, according to a photolithography method, and performing etching using the resist as an etching mask.

The etching enables formation of the removal section 170 in which the second semiconductor layer 105, the buffer layer 106, or the window layer-cum support substrate 107 are exposed, and the non-removal section 180 other than the removal section 170, according to a wet etching method using a wet etchant containing hydrochloric acid.

Alternatively, the device isolation may be carried out by a dry etching method such as an RIE method or an ICP method using a halogen gas, preferably a gas containing hydrogen chloride, besides the wet etching method described above.

Figure 8:
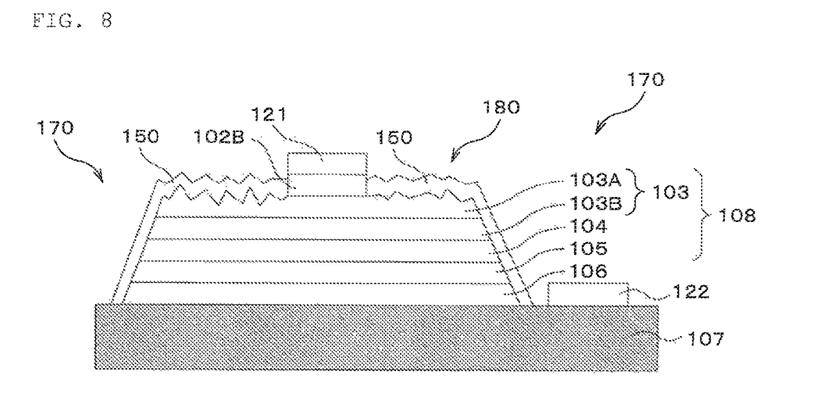
FIG. 8 is a schematic view showing the light-emitting device substrate having a second ohmic electrode and an insulator top coat formed thereon in the manufacturing process of the method for manufacturing a light-emitting device according to the present invention.

Then, as shown in FIG. 8, a second ohmic electrode 122 is formed, in the removal section 170, on the window layer-cum-support substrate 107 or the second semiconductor layer 105 from which the light-emitting portion 108 has been removed (SP10 in FIG. 2).

Then, as shown in FIG. 8, the surface of the first semiconductor layer 103 and the side surface of the light-emitting portion 108 are at least partially coated with an insulator top coat 150 (SP11 in FIG. 2).

The insulator top coat 150 may be made of any material that has transparency and insulating property. As the insulator top coat 150, for example, $SiO_2$ or $SiN_x$ is preferably used. Such materials facilitate processing for opening an upper part of the first ohmic electrode 121 by the photolithography method with an etching liquid containing hydrofluoric acid.

Then, as shown in FIG. 1, the surface and the side surface of the window layer-cum-support substrate 107 are roughened in a second surface roughening treatment step (SP12 in FIG. 2).

Prior to the second surface roughening treatment, a light-emitting device dice is preferably formed by drawing scribe lines along the removal section 170 and breaking and isolating the light-emitting device. After forming the light-emitting device dice, the light-emitting device dice is preferably transferred to a holding tape with the window layer-cum-support substrate 107 upside before the second surface roughening treatment.

The second surface roughening treatment step may be carried out by using a mixed solution containing iodine, an organic acid, and an inorganic acid, in which the organic acid may include any one or more of citric acid, malonic acid, formic acid, acetic acid, and tartaric acid, and the inorganic acid may include any one or more of hydrochloric acid, sulfuric acid, nitric acid, and hydrofluoric acid.

In this manner, the surface can be surely roughened.

The second surface roughening liquid used for roughening the window layer-cum-support substrate 107 in the second surface roughening treatment step has different liquid composition from that of the above-described first surface roughening liquid used for roughening the first semiconductor layer 103 in the first surface roughening treatment step. Thus, these liquids have different etching properties, which lead to different shapes and $R_a$ of the roughened surfaces of the first semiconductor layer 103 and the window layer-cum-support substrate 107.

The above-described method enables prevention of the occurrence of chip cracks during wire bonding by the reduction in mechanical strength of the pad electrode portion due to excessive etching, while keeping the effect of trapping carriers in the clad layer, whereby a light-emitting device having a roughened surface with desired irregularity size can be manufactured.

Example

Hereinafter, the present invention will be more specifically described with reference to Example and Comparative example, but the present invention is not limited thereto.

Example 0.5 μm of an n-type GaAs buffer layer (not shown), 1 μm of a second selective etching layer 102A made of an n-type AlInP layer, and 1 μm of a first selective etching layer 102B made of an n-type GaAs layer were grown on an n-type GaAs substrate 101 with a thickness of 280 μm having a crystal axis inclined at 15° toward a [110] direction from a [001] direction. Then, 5.5 μm of a light-emitting portion 108 constituted of an n-type clad layer (a first semiconductor layer 103), an active layer 104, and a p-type clad layer (a second semiconductor layer 105) which were made of AlGaInP was formed by the MOVPE method. Further, 0.3 μm of a buffer layer 106 made of p-type GaInP was formed, and 1 μm of a layer made of p-type GaP was formed as a part of a GaP window layer-cum-support substrate 107. Then, the product was put into an HVPE furnace, and 120 μm of the window layer-cum-support substrate 107 made of p-type GaP was grown to obtain an epitaxial substrate 109 (see FIG. 3).

The active layer 104 was formed of a plurality of layers made of AlGaInP.

The first semiconductor layer was formed of two layers of a low-Al-content layer 103A and a high-Al-content layer 103B.

The high-Al-content layer 103B had a thickness of 2.0 μm and contained a plurality of layers made of $(Al_xGa_{1-x})_{0.5}In_{0.5}P$ ($0.70 \leq x \leq 1$). The low-Al-content layer 103A had a thickness of 0.6 μm and was made of $(Al_{0.4}Ga_{0.6})_{0.5}In_{0.5}P$.

The second semiconductor layer 105 had a thickness of 1.5 μm and contained a plurality of layers made of $(Al_xGa_{1-x})_{0.5}In_{0.5}P$ ($0.3 \leq x \leq 1$).

Then, the substrate 101, the GaAs buffer layer, and the second selective etching layer 102A were removed by etching to produce a light-emitting device substrate 110 in which the first selective etching layer 102B remained (see FIG. 4).

Then, a first ohmic electrode 121 was formed on the first selective etching layer 102B of the light-emitting device substrate 110 (see FIG. 5), and the first selective etching layer 102B was selectively removed by SPM treatment using the first ohmic electrode 121 as a mask.

Then, the surface of the low-Al-content layer 103A, which was placed in the outermost of the first semiconductor layer 103, was subjected to the first surface roughening treatment step (see FIG. 6). A liquid mixture of acetic acid and hydrochloric acid was prepared as the first surface roughening liquid and used in etching at room temperature for 1 minute to perform the surface roughening treatment. Roughness $R_a$ of the roughened surface of the first semiconductor layer 103 at this time was measured.

In addition, maximum, minimum, and average values of the etching depth at this time were also measured. In the measurement, the shallowest point of irregularities formed by the first surface roughening treatment was defined as the minimum value of the etching depth; the deepest point was defined as the maximum value; and a nearly mean point between the shallowest point and the deepest point was defined as the average value.

Table 1 shows the results measured as above. Table 1 also shows results of Comparative example described later.

TABLE 1

|  | Maxinium value of etching depth [μm] | Minimum value of etching depth [μm] | Average value of etching depth [μm] | Ra [μm] |
| --- | --- | --- | --- | --- |
| Example | 0.54 | 0.11 | 0.41 | 0.32 |
| Comparative example | 1.17 | 0.71 | 0.92 | 0.33 |

As shown in Table 1, in Example, $R_a$ was 0.32 μm. The maximum value of the etching depth was 0.54 μm, the minimum value was 0.11 μm, and the average value was 0.41 μm. On the other hand, in Comparative example described later, $R_a$ was 0.33 μm, which was almost equal to the value in Example, but 0.92 μm of the average etching depth was required in the first surface roughening treatment to achieve this roughness.

Thus, Examples could reduce the etching depth required to obtain a desired roughened shape, compared with Comparative example described later.

Then, regions other than a second ohmic electrode forming region 140 and a scribe region 141 (see FIG. 6) were covered with a resist by the photolithography method, the device isolation step was carried out by the wet etching method with a wet etchant containing hydrochloric acid, and the light-emitting section 108 was removed to form a removal section 170 in which the window layer-cum-support substrate 107 was exposed and a non-removal section 180 other than the removal section 170 (see FIG. 7).

Then, a second ohmic electrode 122 was formed in the removal section 170 (see FIG. 8). Subsequently, an insulator top coat 150 made of $SiO_2$ was laminated to cover the surface of the first semiconductor layer 103 and the side surface of the light-emitting section 108 with the insulator top coat 150. Furthermore, openings were formed in the insulator top coat 150 by processing portions of the first ohmic electrode 121 by the photolithography method and hydrofluoric acid etching.

Then, scribe lines were drawn along the removal section 170, and crack lines were extended along the scribe lines. Thereafter, breaking was carried out to isolate the device, whereby a light-emitting device dice was formed.

After forming the light-emitting device dice, the light-emitting device dice was transferred to a holding tape such that the surface having the first ohmic electrode faced the tape side. Thereafter, the second surface roughening treatment step was carried out. A surface roughening liquid used for roughening the surface of the window layer-cum-support substrate in the second surface roughening treatment step was prepared by mixing acetic acid, hydrofluoric acid, and iodine. Then, the second surface roughening treatment was carried out by etching at room temperature for 1 minute. When roughness of the roughened surface was measured on the surface and the side surface of the window layer-cum-support substrate 107, $R_a$ was 0.5 µm.

Thus, a light-emitting device in which the etching depth required to obtain a desired roughened shape was reduced while keeping the effect of trapping carriers in the clad layer could be manufactured.

Furthermore, an LED chip was manufactured by wire bonding.

As a result, the LED chip could be manufactured without causing chip cracks during wire bonding.

Comparative Example

A light-emitting device was manufactured in the same procedure as in Example except that no low-Al-content layer, but an n-type clad layer with the same thickness as in Example was formed as the layer to be subjected to the first surface roughening treatment.

Thereafter, an LED chip was manufactured by wire bonding as in Example.

The surface roughness after the first surface roughening treatment was measured as in Example. The measurement result is shown in Table 1.

As shown in Table 1, roughness $R_a$ after the first surface roughening treatment was 0.33. The maximum value of the etching depth required to achieve this roughness in the first surface roughening treatment was 1.17 µm; the minimum value was 0.71 µm; and the average value was 0.92 µm.

Moreover, when the roughness after the second surface roughening treatment was measured as in Example, $R_a$ was 0.5 µm.

Moreover, in Comparative example, shock absorbing ability at wire bonding was lowered, and chip cracks were caused.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A light-emitting device comprising:
    a window layer-cum-support substrate;
    a light-emitting portion provided on the window layer-cum-support substrate and including a second semiconductor layer of a second conductivity type, an active layer, and a first semiconductor layer of a first conductivity type in the stated order;
    a first ohmic electrode provided on the first semiconductor layer; and
    an insulator top coat at least partially coating a surface of the first semiconductor layer and a side surface of the light-emitting portion,
    wherein the surface of the first semiconductor layer and a surface of the window layer-cum-support substrate are roughened,
    the first semiconductor layer includes at least two layers of an active-layer-side layer and a roughened-side layer, and the roughened-side layer is formed of a material having a lower Al content than that of the active-layer-side layer, and
    the roughened-side layer of the first semiconductor layer comprises $(Al_xGa_{1-x})_yIn_{1-y}P$ where $0 \le x < 0.6$ and $0.4 \le y \le 0.6$, or $Al_zGa_{1-z}As$ where $0 \le z \le 0.3$, and
    the active-layer-side layer of the first semiconductor layer comprises $(Al_xGa_{1-x})_yIn_{1-y}P$ where $0.6 \le x \le 1$ and $0.4 \le y \le 0.6$, or $Al_zGa_{1-z}As$ where $0.3 < z \le 1$.

2. The light-emitting device according to claim 1, wherein the light-emitting device further comprises:
    a removal section in which a part of the light-emitting portion is removed;
    a non-removal section other than the removal section, the first ohmic electrode provided on the first semiconductor layer in the non-removal section; and
    a second ohmic electrode provided on the window layer-cum-support substrate or the second semiconductor layer in the removal section.

3. A method for manufacturing a light-emitting device, the method comprising:
    a step of forming a light-emitting portion by sequentially growing a first semiconductor layer, an active layer, and a second semiconductor layer in this order on a substrate by epitaxial growth using a material whose lattice matches with the substrate;
    a step of forming a window layer-cum-support substrate on the light-emitting portion by epitaxial growth using a material whose lattice mismatches with the substrate;
    a step of removing the substrate after the step of forming the window layer-cum-support substrate;
    a step of forming a first ohmic electrode on the first semiconductor layer;
    a first surface roughening treatment step of roughening a surface of the first semiconductor layer;
    a device isolation step of forming a removal section in which a part of the light-emitting portion is removed and a non-removal section other than the removal section;
    a step of forming a second ohmic electrode on the window layer-cum-support substrate with the light-emitting portion being removed therefrom;
    a step of at least partially coating the surface of the first semiconductor layer and a side surface of the light-emitting portion with an insulator top coat; and
    a second surface roughening treatment step of roughening a surface and a side surface of the window layer-cum-support substrate,
    wherein in the step of forming the light-emitting portion, the first semiconductor layer is formed so as to have at least two layers of an active-layer-side layer and a roughened-side layer, and the roughened-side layer is formed of a material having a lower Al content than that of the active-layer-side layer.

4. The method for manufacturing a light-emitting device according to claim 3, wherein the roughened-side layer of the first semiconductor layer comprises $(Al_xGa_{1-x})_yIn_{1-y}P$ where $0 \le x < 0.6$ and $0.4 \le y \le 0.6$, or $Al_zGa_{1-z}As$ where $0 \le z \le 0.3$, and
    the active-layer-side layer of the first semiconductor layer comprises $(Al_xGa_{1-x})_yIn_{1-y}P$ where $0.6 \le x \le 1$ and $0.4 \le y \le 0.6$, or $Al_zGa_{1-z}As$ where $0.3 < z \le 1$.

5. The method for manufacturing a light-emitting device according to claim 3, wherein the first surface roughening treatment step is carried out by using a liquid mixture of an organic acid and an inorganic acid, the organic acid including any one or more of citric acid, malonic acid, formic acid, acetic acid, and tartaric acid, the inorganic acid including any one or more of hydrochloric acid, sulfuric acid, nitric acid, and hydrofluoric acid, and
    the second surface roughening treatment step is carried out by using a mixed solution containing iodine, an organic acid, and an inorganic acid, the organic acid including any one or more of citric acid, malonic acid, formic acid, acetic acid, and tartaric acid, the inorganic acid including any one or more of hydrochloric acid, sulfuric acid, nitric acid, and hydrofluoric acid.

6. The method for manufacturing a light-emitting device according to claim 4, wherein the first surface roughening treatment step is carried out by using a liquid mixture of an organic acid and an inorganic acid, the organic acid including any one or more of citric acid, malonic acid, formic acid, acetic acid, and tartaric acid, the inorganic acid including any one or more of hydrochloric acid, sulfuric acid, nitric acid, and hydrofluoric acid, and the second surface roughening treatment step is carried out by using a mixed solution containing iodine, an organic acid, and an inorganic acid, the organic acid including any one or more of citric acid, malonic acid, formic acid, acetic acid, and tartaric acid, the inorganic acid including any one or more of hydrochloric acid, sulfuric acid, nitric acid, and hydrofluoric acid.

* * * * *